United States Patent
Satoi et al.

(10) Patent No.: US 7,836,370 B2
(45) Date of Patent: Nov. 16, 2010

(54) SCAN TEST CIRCUIT, SEMICONDUCTOR INTEGRATED CIRCUIT AND SCAN ENABLE SIGNAL TIME CONTROL CIRCUIT

(75) Inventors: Tomoki Satoi, Kanagawa-ken (JP); Naohiko Nishigaki, Kanagawa-ken (JP)

(73) Assignee: Ricoh Company, Ltd., Tokyo (JP)

(*) Notice: Subject to any disclaimer, the term of this patent is extended or adjusted under 35 U.S.C. 154(b) by 429 days.

(21) Appl. No.: 12/042,783

(22) Filed: Mar. 5, 2008

(65) Prior Publication Data

US 2008/0222470 A1    Sep. 11, 2008

(30) Foreign Application Priority Data

Mar. 7, 2007    (JP)    ............... 2007-057215

(51) Int. Cl.
*G01R 31/28*    (2006.01)
(52) U.S. Cl. .................. 714/731; 714/727; 714/729
(58) Field of Classification Search ............. 324/76.53; 714/726, 731, 727, 729, 724
See application file for complete search history.

(56) References Cited

U.S. PATENT DOCUMENTS

| | | | | |
|---|---|---|---|---|
| 7,202,656 | B1* | 4/2007 | Gearhardt et al. | 324/76.53 |
| 7,444,567 | B2* | 10/2008 | Wang et al. | 714/726 |
| 2005/0240846 | A1* | 10/2005 | Madpuwar et al. | 714/726 |
| 2008/0010573 | A1* | 1/2008 | Sul | 714/731 |
| 2008/0126898 | A1* | 5/2008 | Pandey | 714/731 |

FOREIGN PATENT DOCUMENTS

| | | |
|---|---|---|
| JP | 2001-221836 | 8/2001 |
| JP | 2006-65339 | 3/2006 |

* cited by examiner

*Primary Examiner*—David Ton
(74) *Attorney, Agent, or Firm*—Dickstein Shapiro LLP

(57) ABSTRACT

A SCAN test circuit for giving a semiconductor integration circuit a scan test includes a scan enable signal generating device that generates scan enable signals based on a scan enable external input signal, a clock generator that generate launch and capture clocks for collectively detecting a delay malfunction at a practical operation speed, and a controller configured to control the clock generator based on the scan enable signals.

5 Claims, 5 Drawing Sheets ly by the LSI tester.

SCAN TEST CIRCUIT, SEMICONDUCTOR INTEGRATED CIRCUIT AND SCAN ENABLE SIGNAL TIME CONTROL CIRCUIT

CROSS REFERENCE TO RELATED APPLICATION

This application claims priority under 35 USC §119 to Japanese Patent Application No. 2007-057215, filed on Mar. 7, 2007, the entire contents of which are herein incorporated by reference

BACKGROUND OF THE INVENTION

1. Field of the Invention

The present invention relates to a scan test circuit, a semiconductor integration circuit, and a scan enable signal time control circuit 2. Discussion of the Background Art As a typical test for testing a semiconductor integration circuit, a SCAN/ATPG (Auto Test Pattern Generation) test is exemplified. When an At-Speed test (i.e., a test executed at an operation speed of a practical device) is executed during the SCAN/ATPG test, especially when a high-speed logic operation is executed, an At-Speed clock (a clock used in an operation speed of a practical device) is generated by driving a PLL circuit included in a LSI chip and is used in a capture operation of SCAN. Because, a frequency of a clock inputted from a LSI tester is limited by a ceiling.

Thus, a SCAN test circuit 101 that executes an At-Speed test by driving a PLL circuit included in a LSI chip generally has a configuration as shown in FIG. 3. A SCAN clock and a SCAN enable signal flowing the SCAN test circuit 101 have waveforms as illustrated in FIG. 4.

A control time as shown by the SCAN clock and the SCAN enable (signal) in FIG. 4 is called Broadside. Specifically, clocks, such as a launch clock 42, a capture clock 44, etc., entry twice when the SCAN enable is turned off (i.e., when a SCAN capture operation is executed).

During an interval between rises of the launch clock 42 and the capture clock 44, a test is executed at a practical operation speed, at which a practical device is operated. Test data are set to each of SCAN cells in synchronism with a rise of the launch clock 42. Test result is taken in to each of SCAN cells in synchronism with a rise of the capture clock 44. Since a SCAN enable signal inputted from a LSI tester is constant in this time period, a practical operation speed is not limited by a transition time period, i.e., from when the SCAN enable (signal) is turned on and off.

However, the Broadside needs clocks to set test data. Because, test data set by the launch clock 42 is controlled by data set to the SCAN cell by a last clock of a SCAN shift. Accordingly, to achieve malfunction detection at high percentage, a test pattern length and an ATPG execution time period generally become longer in comparison with a SCAN/ATPG (test) that detects single degeneracy malfunction.

Waveforms of a SCAN clock (signal) and a SCAN enable (signal) appearing in the SCAN test circuit when an SCAN/ATPG test is executed using a Launch-off-shift system are illustrated in FIG. 5. In such a Launch-off-shift system, test data are set to a SCAN cell in synchronism with a last clock of the SCAN shift as in the SCAN/ATPG test that detects single degeneracy malfunction. Thus, the ATPG execution time period and the test pattern length are generally as same as those in the SCAN/ATPG test that detects single degeneracy malfunction.

Specifically, in the Launch-off-shift system, an interval between the last clock of the SCAN shift (i.e., a launch clock 52) and the capture clock 54 represents a clock cycle for delay malfunction detection. Specifically, during the interval, a SCAN enable signal of the LSI tester needs to switch from turning on to off, and the clock cycle is thus limited. Accordingly, an At-Speed test (a practical operation speed), in which the PLL circuit of the LSI chip is driven, is hardly achieved.

The Japanese Application Laid Open No. 2001-221836 only discusses an integrated circuit testing method and apparatus that widely detects malfunctions using a short test length with a downsized hardware.

As mentioned above, when the Broadside system is used to apply the At-Speed test during the SCAN/ATPG test to the semiconductor integration circuit, both of the ATPG execution time period and the test pattern length become longer and costly. When it is attempted to decrease both of the ATPG execution time period and the test pattern length, the malfunction detection cannot be achieved at high percentage. Further, when the Launch-off-shift system is used, the At-Speed test cannot be executed, because of limitation on a SCAN enable signal caused by the LSI tester.

SUMMARY OF THE INVENTION

Accordingly, an object of the present invention is to improve such background arts technologies and provides a new and novel SCAN test circuit for giving a semiconductor integration circuit a scan test. Such a new and novel A SCAN test circuit includes a scan enable signal generating device that generates scan enable signals at plural times based on a scan enable external input signal, a clock generator that generate launch and capture clocks for collectively detecting a delay malfunction at a practical operation speed, and a controller configured to control the clock generator based on the scan enable signals.

In another embodiment, a signal inputting device inputs a selection signal for instructing selection of one of a first mode, in which the launch and capture clocks are generated, and a second mode, in which the scan enable signals are not generated while the scan enable external input signal is connected to a scan cell.

In yet another embodiment, a semiconductor integration circuit constitutes the SCAN test circuit.

In yet another embodiment, a scan enable signal time control circuit constitutes a SCAN test circuit for giving a semiconductor integration circuit a scan test. The herein scan enable signal generation time control circuit controls generation of launch and capture clocks for detecting a delay malfunction of a scan cell in the scan test circuit at a practical operation speed by controlling a time when a scan enable signal is turned on or off based on an external input signal.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
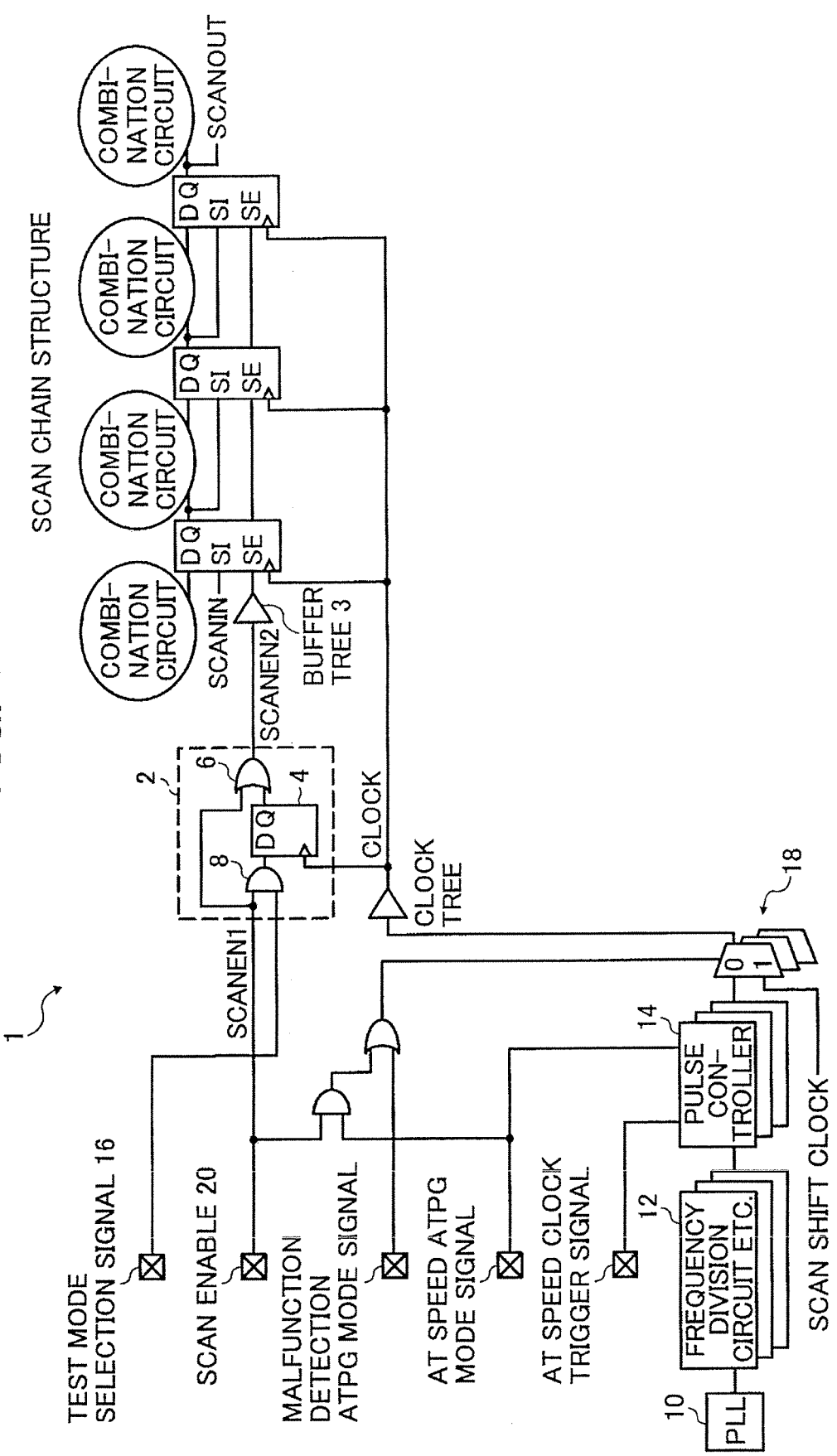
FIG. 1 illustrates an exemplary SCAN test circuit included in a semiconductor integration circuit according to one embodiment of the present invention.
Figure 2:
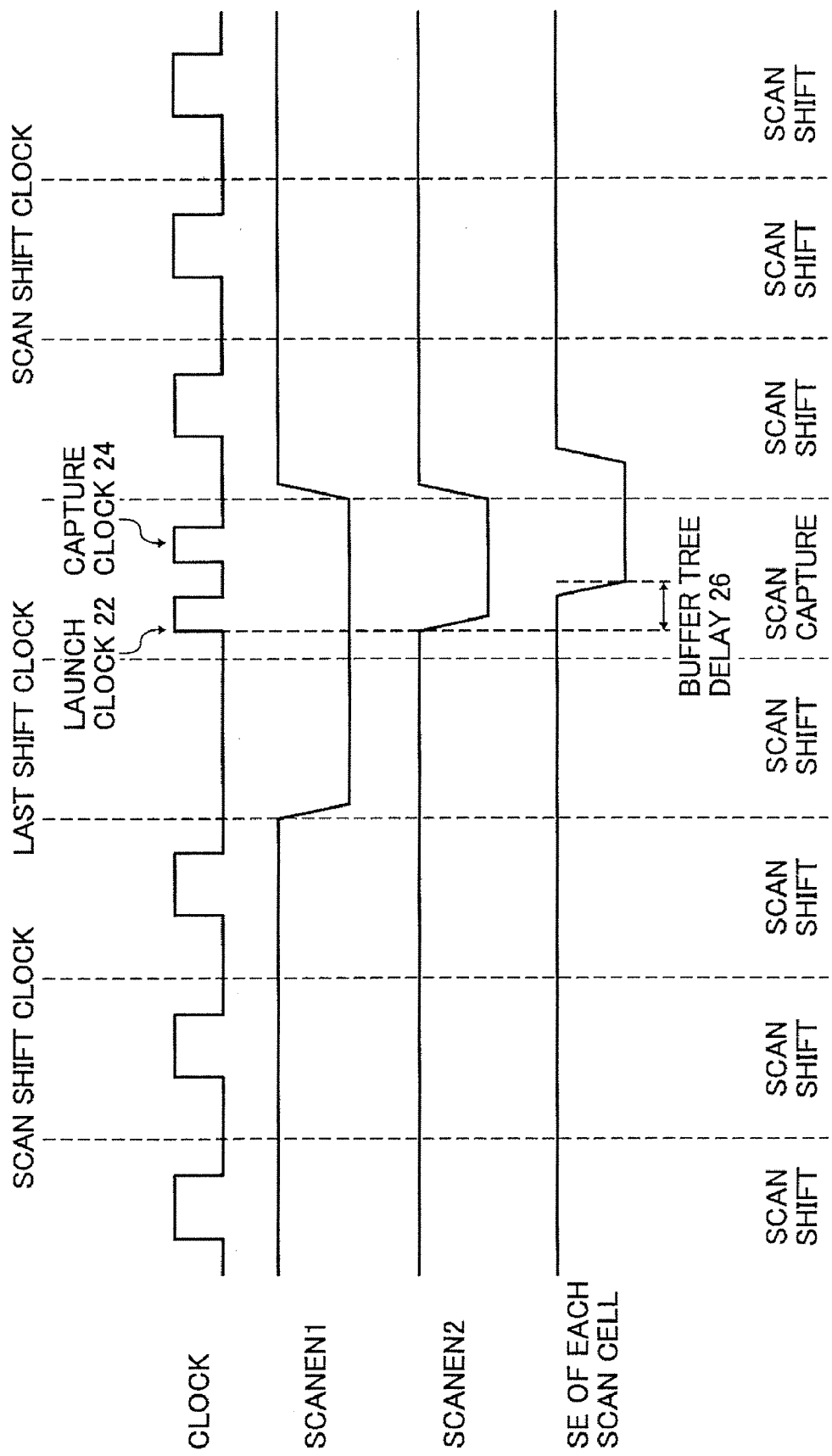
FIG. 2 illustrates exemplary waveforms of a SCAN clock, a signal (SCANE N1) as an SCAN enable input, a signal (SCANE N2) as an input to a buffer tree in front of a SCAN cell, and a scan enable signal given to the SCAN cell in the SCAN test circuit of FIG. 1.
Figure 3:
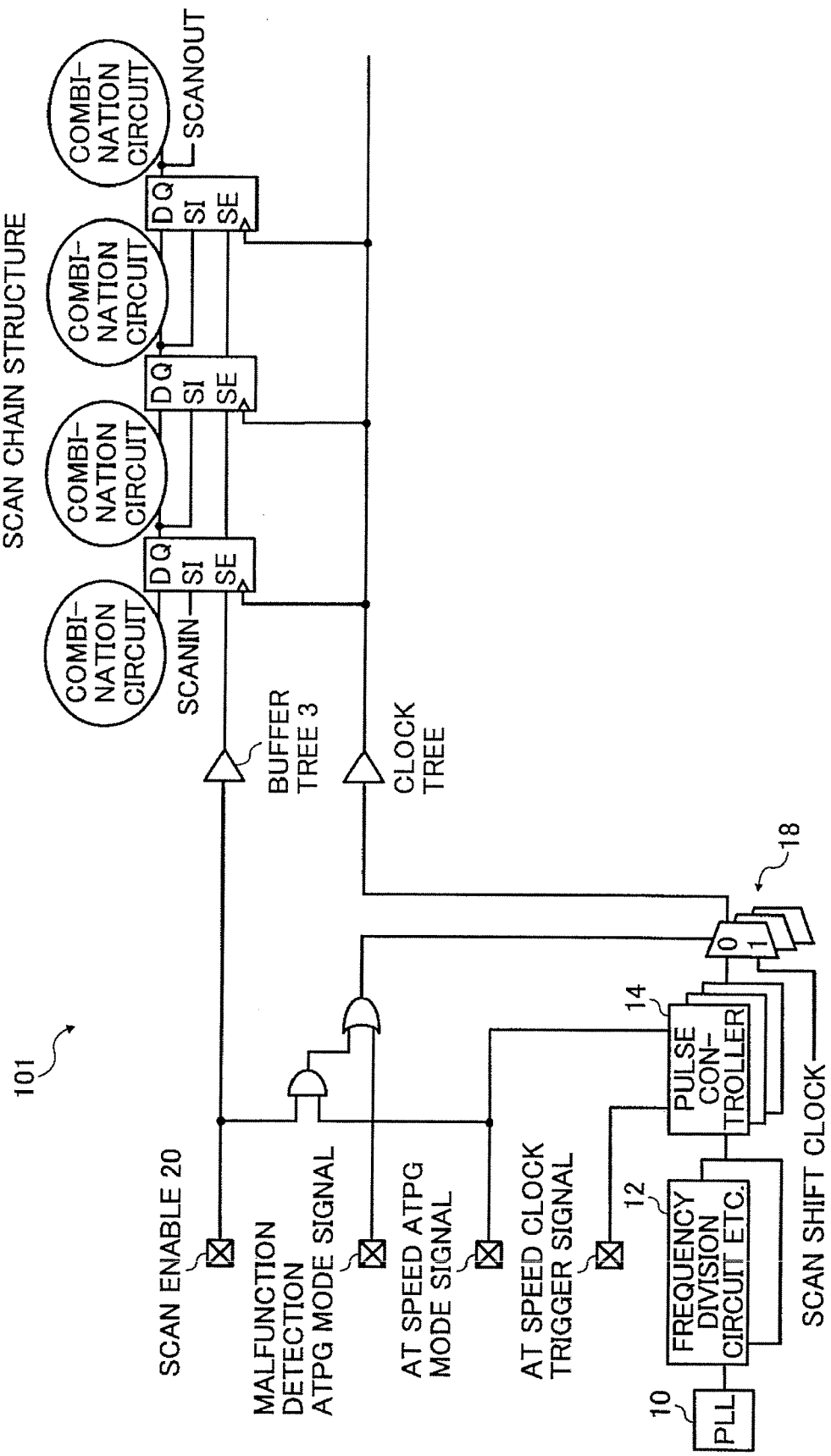
FIG. 3 illustrates a conventional SCAN test circuit in a semiconductor integration circuit.

Referring now to the drawing, wherein like reference numerals designate identical or corresponding parts throughout several views, in particular in FIG. 1, a clock generated in a PLL circuit 10 is inputted to a clock controller 14 via a frequency divider 12 or the like in a SCAN test circuit 1. The clock controller 14 receives a pulse as an At-Speed clock including a launch clock 22 and a capture clock 24 as shown in FIG. 2 from an At-Speed ATPG mode signal terminal and an At-Speed clock trigger signal terminal for SCAN testing use.

A clock selection circuit 18 selects one of a SCAN shift use clock and an At-Speed capture use clock in accordance with a SCAN enable signal externally inputted to a SCAN enable external terminal 20. Then, an At-Speed test use SCAN clock is provided to the SCAN test circuit 1.

A scan enable signal time control circuit 2 is inserted between the SCAN enable external terminal 20 and a buffer tree 3 arranged in front of a SCAN cell. The buffer tree 3 generally divides load. The scan enable signal time control circuit 2 includes a D-flip flop 4, an OR circuit 6 arranged on the output side of the D-flip flop 4, and an AND circuit 8 arranged on the input side thereof.

Although only one scan enable signal time control circuit 2 is arranged in the circuit of FIG. 1, such a circuit 2 can be inserted per clock domain while dividing the SCAN enable external input 20.

Figure 4:
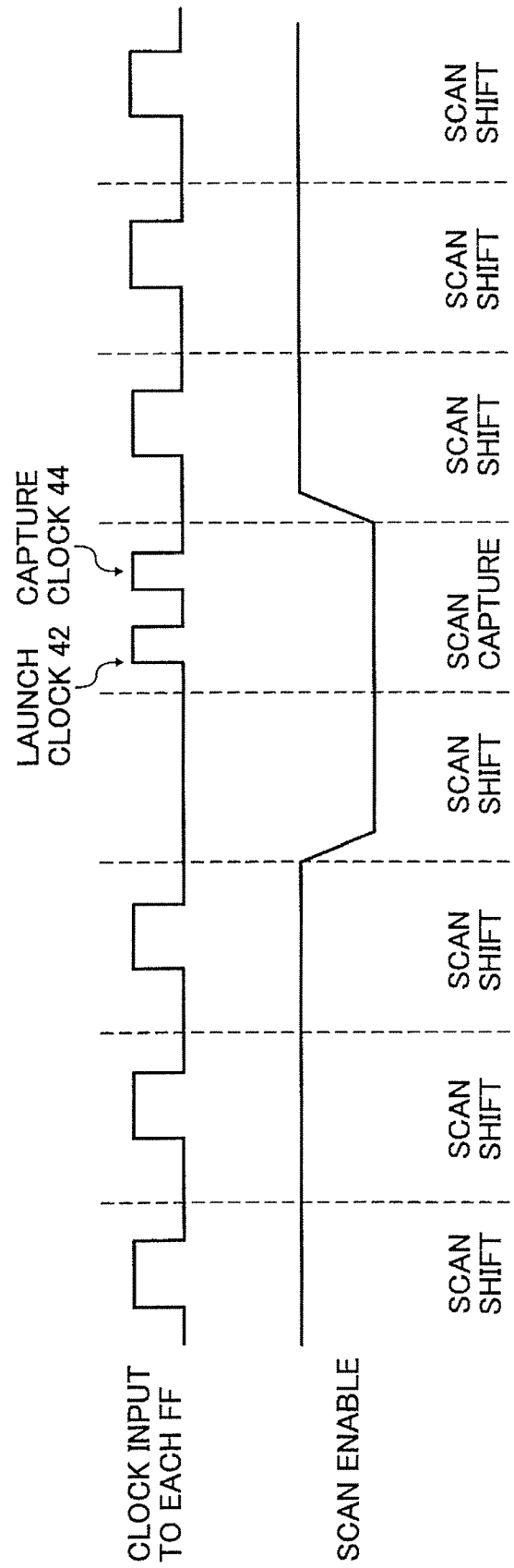
FIG. 4 illustrates exemplary waveforms of a SCAN clock and an SCAN enable signal in the conventional SCAN circuit of FIG. 3.
Figure 5:
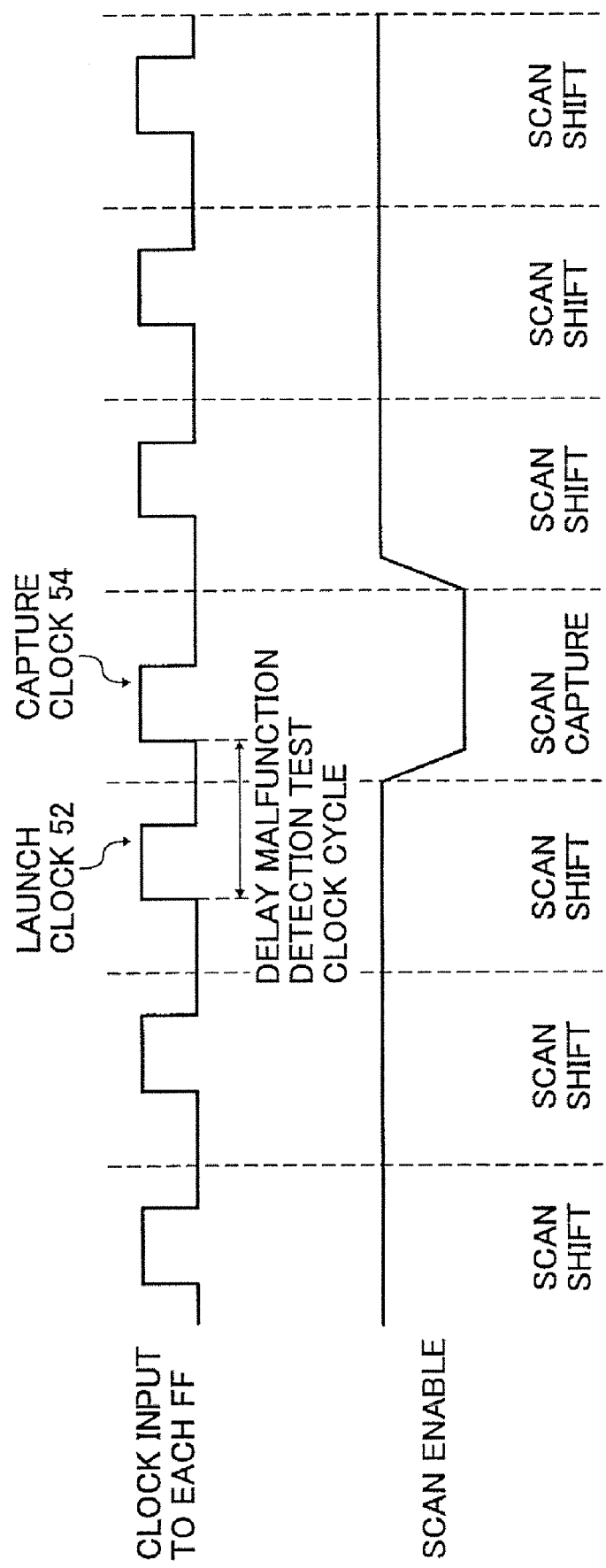
FIG. 5 illustrates exemplary waveforms of a SCAN clock and an SCAN enable signal in the SCAN test circuit appearing when the SCAN/ATPG test is executed using a Launch-off-shift system.

A test mode selection signal terminal 16 is connected to an external input terminal or a user command output terminal of a JTAG. When this mode is zero (i.e., low at an AND circuit 8), an At-Speed test can be executed using a conventional Broadside system as shown in FIG. 4 by a function of the AND circuit 8.

Where as when the mode is one (i.e., High at the AND circuit 8), waveforms of SCANEN1, SCANEN2, and SE change as shown in FIG. 2. Specifically, the SCANE N2 is turned off by the D-flip flop 4 in synchronism with a rise of the launch clock 22, and is turned on by the OR circuit 6 in synchronism with a rise of the SCANEN1. In this situation, since the launch clock 22 serves as the last clock for a SCAN shift (i.e., a time when SE maintains a high level), a launch off shift time (i.e., one cycle of the launch clock when SCANEN2 becomes low) is provided.

To change the SCANEN2 into the low level at the time of the Launch-off-shift, the SCAN enable (i.e. SE) should be fixed to be a low level until the capture clock 24 rises. Since the OR circuit 6 and the buffer tree 3 are arranged between the SCANEN2 and each of SEs of SCAN cells, there exists a delay (i.e., a buffer delay 26) between both of the signals corresponding to one step of the OR circuit and the buffer tree (i.e., a buffer tree delay 26). Such a buffer tree delay 26 is preferable if being shorter than a cycle of the At-Speed clock.

Since a lot of SCAN cells is connected to the buffer tree 3, and accordingly load of these are heavy, the buffer tree delay 26 sometimes cannot meet the above-mentioned time condition. In such a situation, a plurality of scan enable signal time control circuits 2 are preferably arranged in the same clock domains, respectively, so that a number of SCAN cells connected to one piece of the scan enable signal decreases and the load can be reduced, thereby the time condition is met. The time of the SCAN enable signal (SE) can be confirmed during when the launch clock last shift clock 22 drops and the capture clock 24 drops using STA.

One embodiment of a SCAN test circuit 1 causes a SCAN/ATPG tool to form a test pattern of a Launch-off-shift system. Thus, an ATPG execution time period and a length of a test pattern become shorter in comparison with a case when the Broadside system is used. Further, a delay malfunction can be detected at high percentage.

Since clocks of a Broadside system are practically provided as SCAN clocks, a SCAN shift increases by an amount corresponding to one clock per one SCAN cycle in comparison with a case when the launch-off-shift system is used. However, such increase can be handled by delaying an input of test date from an SCANIN corresponding to one clock, for example.

Thus, in the SCAN/ATPG test using the Launch-off-shift system by means of the above-mentioned SCAN test circuit 1, the At-Speed test can be performed avoiding limitation from the LSI tester.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A SCAN test circuit for giving a semiconductor integration circuit a scan test, comprising:
   a scan enable signal generating device configured to generate first and second scan enable signals based on an input of an external scan enable signal;
   a clock generator configured to generate launch and capture clocks in a prescribed time for collectively detecting a delay malfunction at a practical operation speed; and
   a controller configured to control the clock generator to generate the capture clock based on the scan enable signal.

2. The SCAN test circuit as claimed in claim 1, further comprising:
   at least one scan cell; and
   a signal inputting device configured to input a selection signal for selecting one of a first mode, in which the launch and capture clocks are generated, and a second mode, in which the scan enable signals are not generated while the scan enable external input signal is connected to the at least one scan cell.

3. A semiconductor integration circuit mounting the SCAN test circuit as claimed in claim 1.

4. A scan enable signal time control circuit constituting a SCAN test circuit including at least one scan cell for giving a semiconductor integration circuit a scan test, wherein said scan enable signal time control circuit controls generation of launch and capture clocks to be inputted to the at least one scan cell by controlling a time when a scan enable signal created based on an external input signal is turned on or off, said launch and capture clocks collectively detecting a delay malfunction at a practical operation speed.

5. A SCAN test circuit for giving a semiconductor integration circuit a scan test, comprising:

a scan enable signal generating device configured to generate first and second scan enable signals based on an input of an external scan enable signal;

a clock generator configured to generate launch and capture clocks in a prescribed time for collectively detecting a delay malfunction at a practical operation speed; and a controller configured to control the second enable signal to turn on or off in response to generation of the launch clock and control the clock generator to generate the capture clock before the second enable signal turns off or on.

* * * * *